United States Patent
Watanabe et al.

[11] Patent Number: 6,043,146
[45] Date of Patent: Mar. 28, 2000

[54] PROCESS FOR FORMING A SEMICONDUCTOR DEVICE

[75] Inventors: Joy Kimi Watanabe; John Joseph Stankus, both of Austin, Tex.

[73] Assignee: Motorola, Inc., Schaumburg, Ill.

[21] Appl. No.: 09/122,709

[22] Filed: Jul. 27, 1998

[51] Int. Cl.[7] ................................................. H01L 29/06
[52] U.S. Cl. .......................... 438/623; 438/626; 438/239; 438/397
[58] Field of Search ..................................... 438/238, 239, 438/396, 397, 597, 598, 618, 620, 622, 623, 624, 626, 628, 690, 691, 692, 631, 633, 634

[56] References Cited

U.S. PATENT DOCUMENTS

| | | | |
|---|---|---|---|
| 5,506,177 | 4/1996 | Kishimoto et al. | 438/624 |
| 5,612,254 | 3/1997 | Mu et al. | 438/634 |
| 5,721,167 | 2/1998 | Subramanian et al. | 438/238 |
| 5,880,018 | 3/1999 | Boeck et al. | 438/623 |
| 5,893,752 | 4/1999 | Zhang et al. | 438/687 |

OTHER PUBLICATIONS

Zurcher, et al; U.S. Appl. No. 08/995,534 filed Dec. 29, 1997.
Kim, et al; U.S. Appl. No. 08/780,113 filed Dec. 26, 1996.

*Primary Examiner*—Olik Chaudhuri
*Assistant Examiner*—Anh Duy Mai
*Attorney, Agent, or Firm*—George R. Meyer

[57] ABSTRACT

A buffer film (154, 164) is formed over an underlying film (153, 162) to protect that underlying film (153, 162) from damage during a removal sequence, such as polishing. Scratches, gouging, smearing that can occur to the underlying layer (153, 162) are less likely to occur because of the presence of the buffer film (154, 164). In some embodiments, an insulating film (162) is to be protected. The buffer film (164) is formed over the insulating film (162), and the insulating and buffer films (162 and 164) are patterned. During a subsequent conductive layer polishing operation in an embodiment, most of the buffer film (164) is removed. In still another embodiment, a buffer film (154) is formed over a conductive layer (153) to protect it during "gap fill" process sequence. Although residual portions of the buffer film (154, 164) are usually removed, in some instances, those residual portions can remain if there are no significant adverse affects.

18 Claims, 9 Drawing Sheets

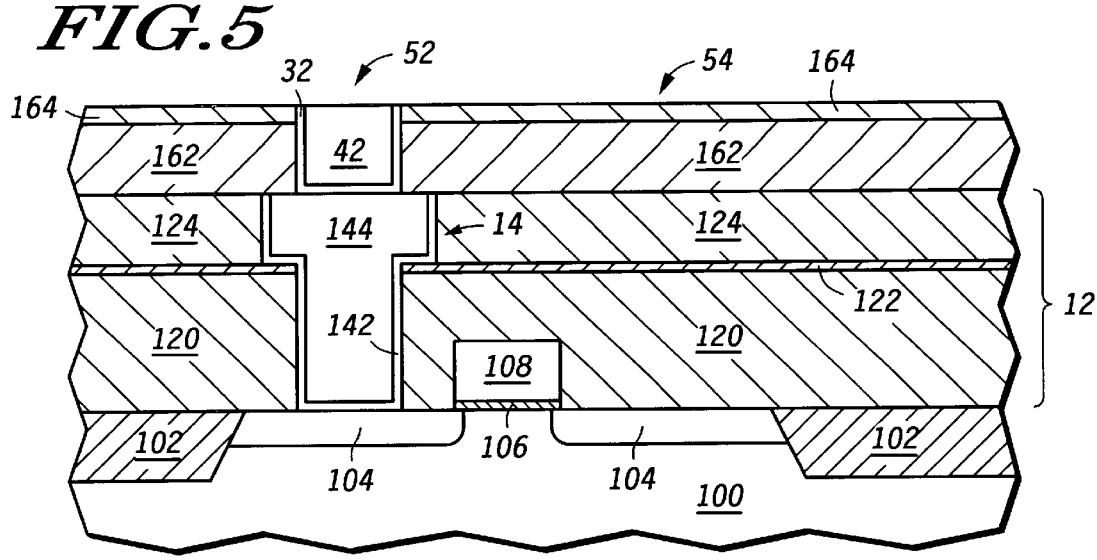
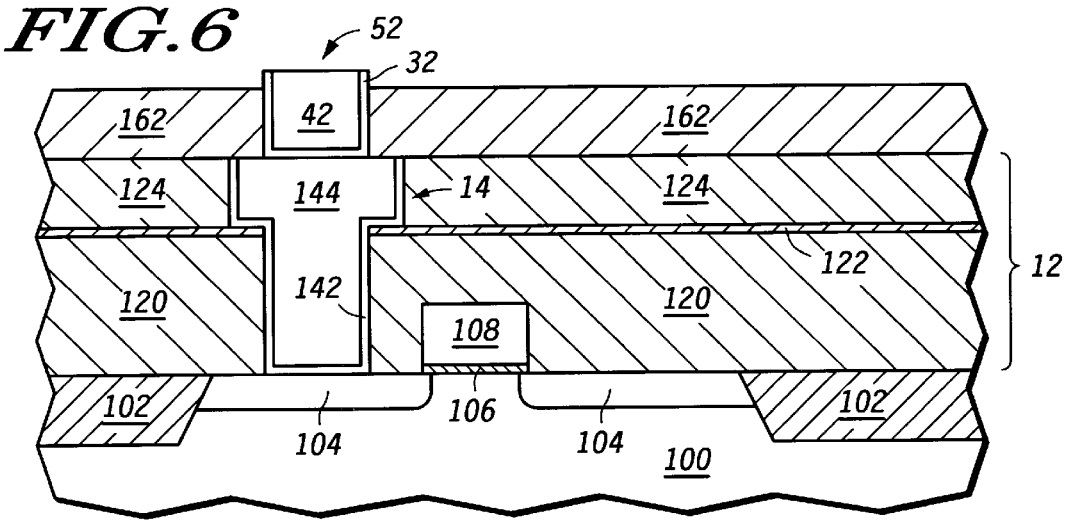
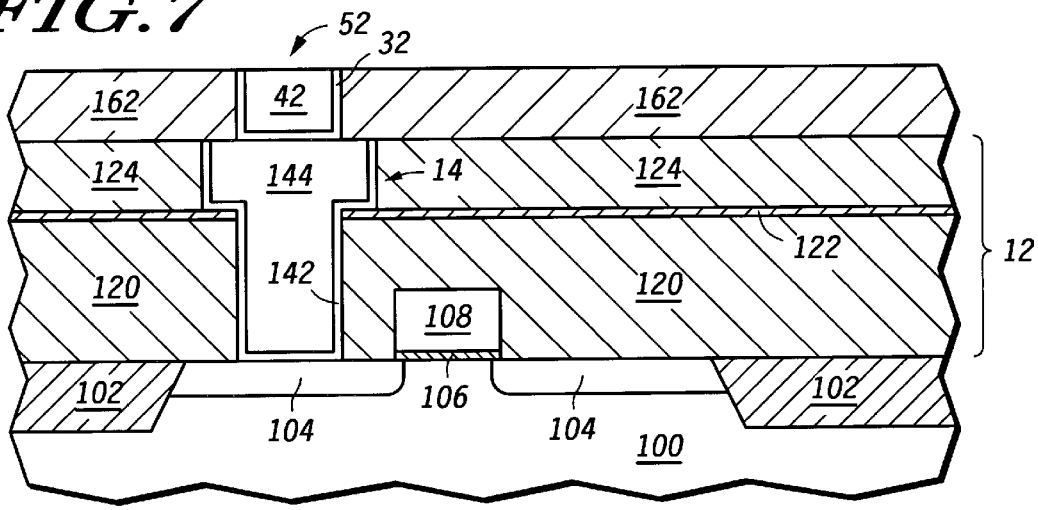

PROCESS FOR FORMING A SEMICONDUCTOR DEVICE

RELATED APPLICATIONS

This is related to U.S. patent application Ser. No. 08/780, 113, entitled "Process for Polishing a Semiconductor Device Substrate" filed on Dec. 26, 1996, now U.S. Pat. No. 5,916,011 and U.S. patent application Ser. No. 08/995,534, entitled "Method for Forming a Semiconductor Device" filed on Dec. 22, 1997, abandoned. These applications are assigned to the current assignee hereof and are incorporated herein by reference.

FIELD OF THE INVENTION

This invention relates in general to processes for forming semiconductor devices, and more particularly, to methods of processes for forming semiconductor devices using polishing.

BACKGROUND OF THE INVENTION

Semiconductor devices are requiring smaller dimensions as operational speeds of those devices increase. Currently, small dimensional devices require polishing in order to form the semiconductor devices. Single inlaid and dual inlaid interconnects are being used to provide the proper connections within the semiconductor device. A problem arises in that many interconnects include a barrier layer that is formed before forming the primary conductive fill material. When polishing the films to form the interconnect, typically scratches form within the underlying insulating layer. These produce visual and potentially electrical defects and are undesired.

In still other devices, the interconnects can include materials that are difficult to polish, such as platinum and iridium, because they are not readily oxidized or hydroxylated using typical polishing slurries. Therefore, polishing these materials generally relies more on the mechanical component of chemical-mechanical polishing compared to copper, aluminum, tungsten, or other materials that are more readily oxidized or hydroxylated. The greater mechanical component increases the likelihood of forming undesired scratches in underlying layers.

Attempts to remove of the scratches in the underlying layer have included using a short polish or removal step. The additional polishing or removal step increases cycle time or is only marginally effective in removing the scratches. Further, if the scratches are deep enough, too much of the underlying layer may need to be removed before the level of scratches is at an acceptable level.

Another attempt to reduce particles includes using a relatively soft poromeric pad, such as a Polytex™ polishing pad made by Rodel, Inc. of Newark, Del. instead of a relatively harder pad, such a Suba™ polishing pad that is also made by Rodel. While the relatively softer polishing pad may reduce the magnitude of the scratches, it does not eliminate them because the particles from the barrier layer are still dragged across the surface during polishing.

BRIEF DESCRIPTION OF THE DRAWINGS

The present invention is illustrated by way of example and not limitation in the accompanying figures, in which like references indicate similar elements, and in which:

FIGS. 1–7 include illustrations of cross-sectional views of a portion of a semiconductor device during fabrication in accordance with an embodiment of the present invention;

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

A buffer film is formed over an underlying film to protect that underlying film from damage during a removal sequence, such as polishing. Scratches, gouging, smearing that may occur to the underlying film are less likely to occur because of the presence of the buffer layer. In some embodiments, an insulating film is to be protected. The buffer film is formed over the insulating film, and the insulating and buffer films are patterned. In an embodiment, most of the buffer film is removed during a subsequent conductive layer polishing operation. In still another embodiment, a buffer film is formed over a conductive layer to protect it during "gap fill" process sequence. In other embodiments, the process can also be used to form optical waveguides and buried or shielded interconnects. Although residual portions of the buffer film are usually removed, in some instances, those residual portions can remain if there are no significant adverse affects.

Figure 1:
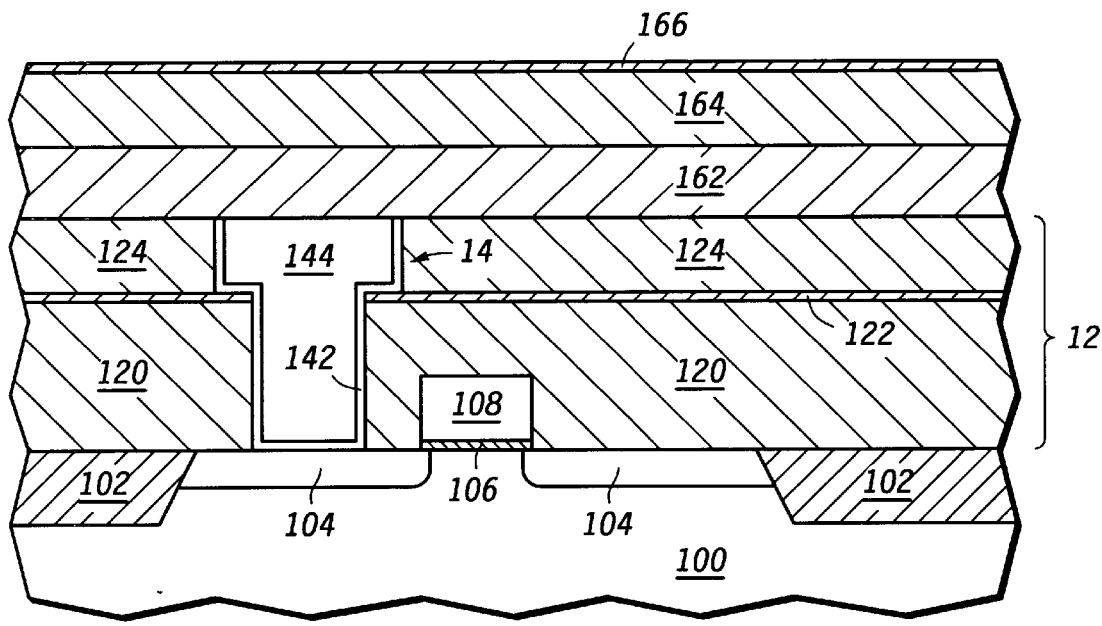

FIG. 1 includes an illustration of a cross-sectional view of a portion of a semiconductor device substrate 100 that includes a transistor and an interconnect. The semiconductor device substrate 100 can be a monocrystalline semiconductor wafer, a semiconductor-on-insulator wafer, or any other substrate used to form semiconductor devices. Field isolation regions 102 and doped region 104 are formed within the substrate 100. A gate dielectric layer 106 and a gate electrode 108 overlie portions of the doped regions 104 and substrate 100. A first interlevel dielectric (ILD) layer 12 overlies the gate electrode 108 and other portions of the substrate 100. The first ILD layer 12 includes a lower insulating film 120, an etch stop film 122, and an upper insulating film 124. The interconnect 14 is formed through the ILD layer 12 and contacts one of the doped regions 104. The interconnect 14 includes a barrier layer 142 and a conductive fill material 144. The device structure up to this point can be formed using a conventional processing method.

A second ILD layer is formed over the interconnect 14 and first ILD layer 12. The second ILD layer includes an insulating film 162, a buffer film 164, and an optional hard mask film 166. The insulating film 162 can be a low-k dielectric material in the semiconductor industry. For the purposes of this specification, low-k means that the dielectric constant of the film is no greater than approximately 3.5. In some embodiments, the insulating film 162 is more susceptible to scratches and mechanical deformations compared to conventional silicon oxide films. Examples include highly porous materials, such as aerogels, xerogels, and some types of organic polymers. Other examples include other organic materials that tend to be susceptible to scratching or tearing.

The buffer film 164 should be capable of withstanding polishing but also should be easily removed without adversely affecting exposed or underlying layers that could be exposed during a removal step. The buffer film 164 includes benzo-cyclobutene, polyvinylacetate, polyvinylalcohol, polyethylene, polypropylene, polymethylmethacrylate, polyquinoline, Avatrel™, or the like. Avatrel™ is a polynorbornene-based material and is made by BFGoodrich Company of Richfield, Ohio. If a polymer is used for the buffer film 164, it should generally be a low molecular weight noncrosslinking hydrocarbon material capable of withstanding the process sequence for which the material will be subjected.

Typically, the buffer film 164 is formed by coating the film over the substrate similar to a photoresist process. In other words, the material for the buffer film 164 is dissolved within a solvent, such as xylene, a ketone, or the like. After coating the film, it is typically soft baked to drive off carrier solvents. In the case of benzo-cyclobutene, the film may need to be cured to make the film more robust during the polishing step. However, if polyvinylacetate, polyvinylalcohol, polyethylene, polypropylene, or polymethylmethacrylate is used, curing is optional. If a cure step is performed, it is usually performed using a hot plate on a track system. The temperature of the cure is generally performed in a range of approximately 250–400° C. The buffer film 164 typically has a thickness of at least approximately 100 nanometers, and usually, has a thickness in a range of approximately 200–600 nanometers. The buffer film 164 is typically thicker than polish-stop or antireflective films.

The optional hard mask film 166 is typically a silicon oxide, silicon oxynitride, or silicon nitride film that is deposited using a chemical vapor deposition method. The chemical vapor deposition can be performed as a plasma assisted or a non-plasma assisted deposition. The hard mask film 166 allows reworking an overlying subsequently formed photoresist layer (not shown) without attacking an underlying organic film (such as film 164 if it includes an organic-based low-k film) before etching occurs. If the solvents used to remove a photoresist layer for rework are different from solvents that can remove the buffer film 164, the hard mask film 166 may not be necessary.

Figure 2:
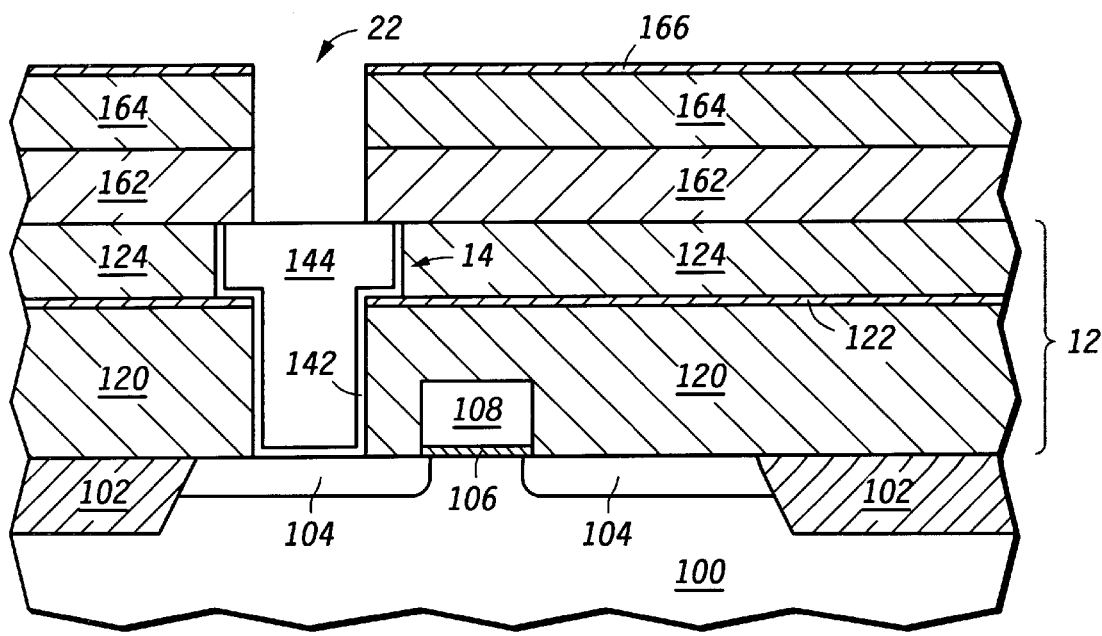
Figure 3:
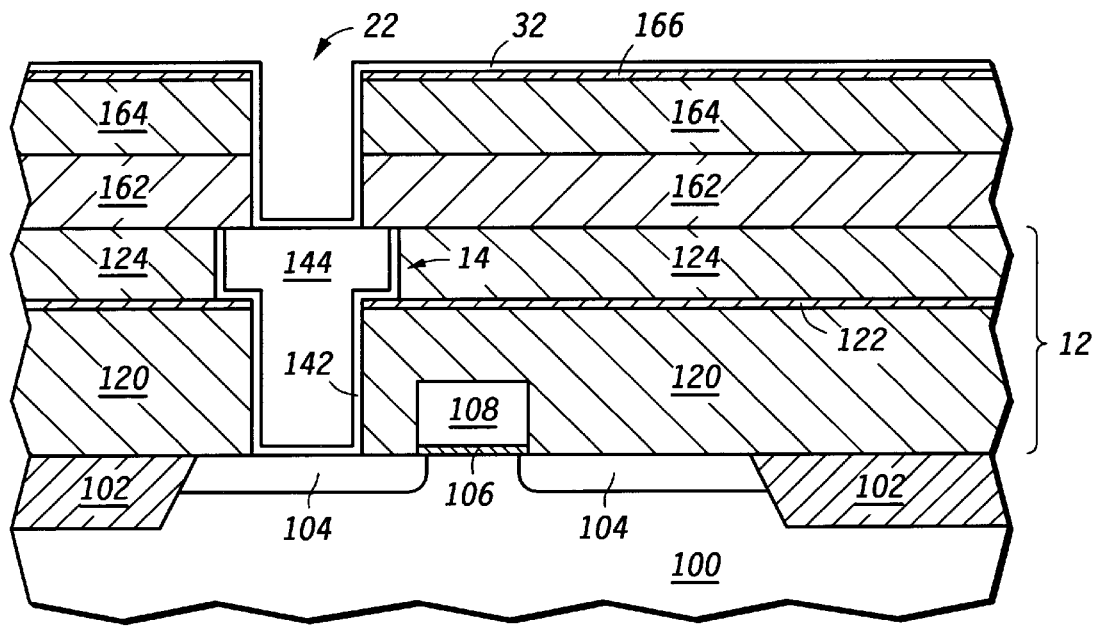

An opening 22 is formed through the films 162, 164, and 166 to expose a portion of the interconnect 14 as shown in FIG. 2. A conductive layer is formed over the hard mask film 166 and includes a barrier film 32 and a conductive fill material 42. The barrier film 32 is formed overlying the hard mask film 166 and within the opening 22 as illustrated in FIG. 3. The barrier film can include any refractory metal compound, such as titanium, tantalum, tungsten, titanium-tungsten, titanium nitride (TiN), tantalum nitride (TaN), tungsten nitride (WN), titanium silicon nitride (TiSiN), tantalum silicon nitride (TaSiN), tungsten silicon nitride (WSiN), and the like.

Figure 4:
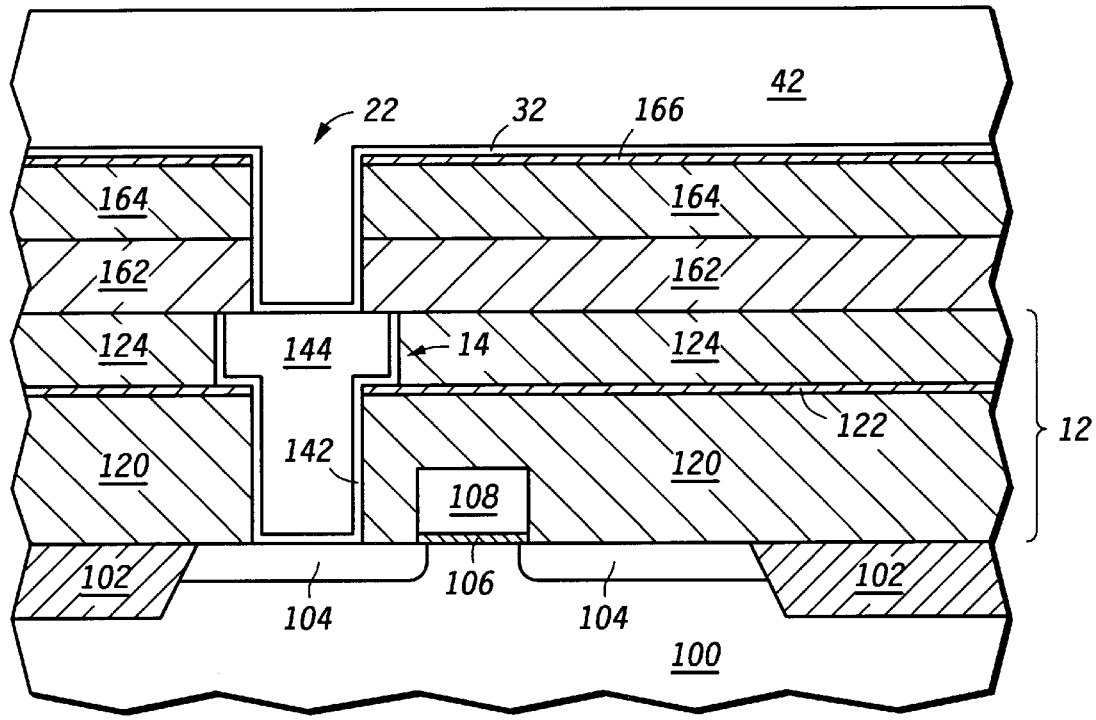

The conductive fill material 42 overlies the barrier film 32 and fills the opening 22 as shown in FIG. 4. The conductive fill material 42 can be formed by first depositing a seed film and then plating the balance of a similar material overlying the seed film. For example, in the case of copper, a very thin copper film is deposited by physical vapor deposition or electroless plating methods followed by electroplated copper. For simplicity, these two films are illustrated as the conductive fill material 42. Another material including tungsten or aluminum could be formed in place of copper. The conductive fill material 42 can be formed using one or any other number of steps. In this embodiment, films 32 and 42 include different materials and have different properties.

Polishing is performed to remove portions of the conductive fill material 42 and barrier film 32 that overlie the insulating film 162 to form the interconnect 52 as illustrated in FIG. 5. The polishing also removes the hard mask film 166. Unlike polish-stop and etch-stop films where significantly less than half of the polish-stop or etch-stop film is removed, most of the buffer film 164 is removed. Because the barrier film 32 may fracture into particles that are relatively hard, any scratches that may form are formed within the buffer film 164 instead of the insulating film 162. At this point in the process, a substantially planar surface 54 is achieved.

The remaining portion of the buffer film 164 is then removed as shown in FIG. 6. Depending on the material used for the buffer film 164, one of many different types of removal processes can be used. For example, if the buffer film 164 is organic, a plasma ash using oxygen can be used. Still, other methods can be used. For example, in the case of benzo-cyclobutane or polyvinylacetate, a thermal decomposition can be performed. If the conductive fill material 42 includes copper, this decomposition is typically performed at a temperature of at least approximately 350° C. in a substantially oxygen-free ambient to reduce the likelihood of oxidizing the surface of the copper. If the underlying material is resistant to oxygen interaction, or forms an oxide that is easily removed, then oxygen can be present during the decomposition.

For polyvinylalcohol, an aqueous solution can be used. The aqueous solution can be at nearly any temperature including room temperature (approximately 20° C.) or even an elevated temperature close to boiling (100° C.). If the underlying material includes copper, other chemicals can be added to the aqueous solution to passivate or reduce the likelihood of oxidizing or corroding the copper film. For example, organic amines or benzo-triozole can be added to the solution. In still other embodiments, an organic solvent, such as xylene (ortho-, meta-, or para-, or any combination thereof), a ketone, and the like can be used. Depending on the chemical selected, care may be necessary to reduce the likelihood of adverse interactions between the chemical and the underlying conductive fill material 42 and the insulating film 162.

After the buffer film 164 is removed, the interconnect 52 lies at a higher elevation that the rest of the substrate as shown in FIG. 6. If the interconnect 52 is too high above the upper surface of the insulating film 162, an optional buff polish can be performed to achieve a more planar surface as shown in FIG. 7. Although not shown, a passivation layer can be formed over the interconnect 52. Other ILD layers and interconnect levels can be added, if needed.

Figure 8:
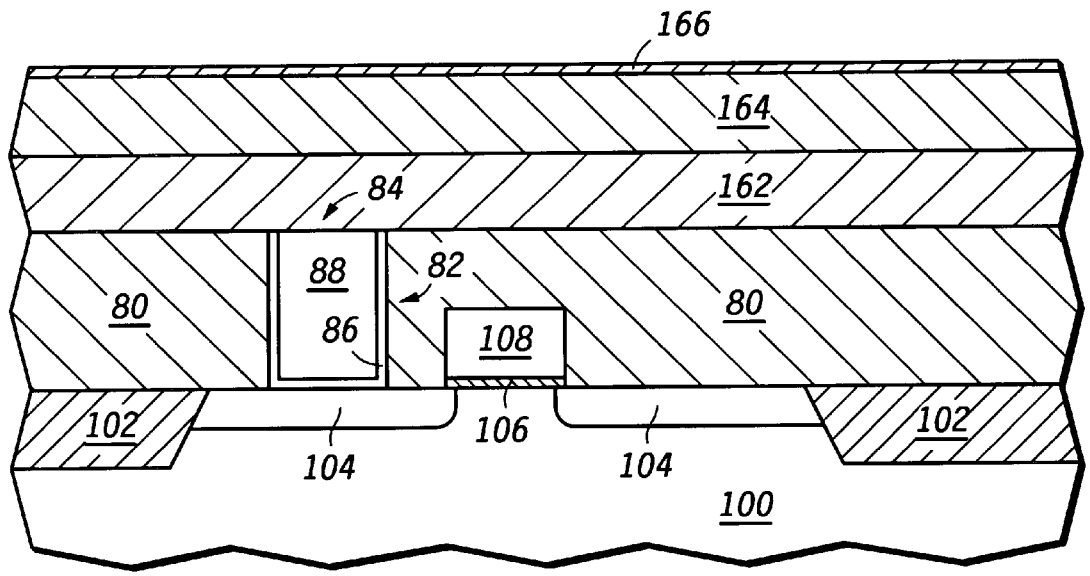
FIGS. 8–14 include illustrations of cross-sectional views of a portion of a semiconductor device during fabrication in accordance with another embodiment of the present invention.

In another embodiment, a buffer film helps to protect an underlying insulating film when a conductive film that is relatively difficult to oxidize is being polished. Usually, the mechanical component of chemical-mechanical polishing is more important to polish the film. Typically, a higher down force pressure or higher substrate or platen rotational speed is used. Turning to FIG. 8, a portion of a semiconductor device substrate 100 is illustrated having many of the same elements as previously described. In this particular embodiment, an ILD layer 80 is formed over the gate electrode 108 and substrate 100. The ILD layer 80 is patterned to form a contact opening 82 that includes a conductive plug 84. The conductive plug 84 includes a barrier film 86 and a conductive fill material 88. Typically, the conductive fill material 88 can be tungsten, although other materials could be used. An insulating film 162, buffer film 164, and hard mask film 166 are formed over the substrate 100. The films 162, 164, and 166 are made of the materials as previously described.

Figure 9:
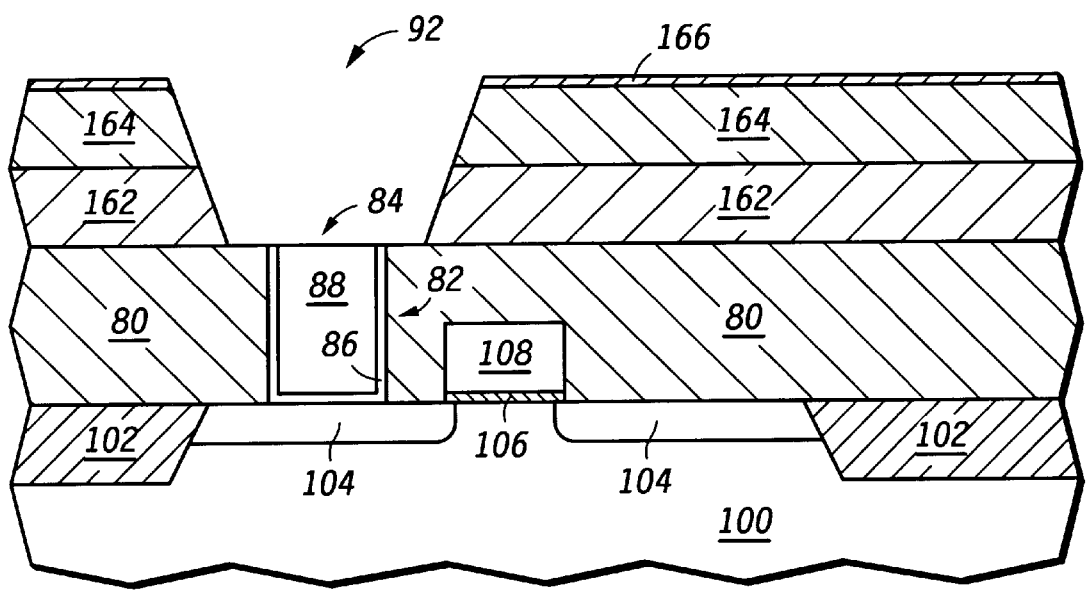
Figure 10:
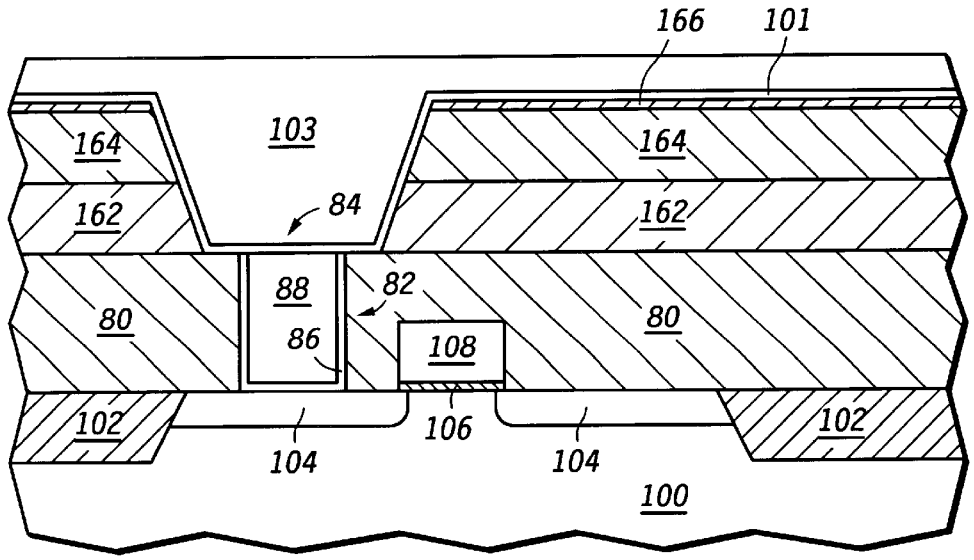

The films 162, 164, and 166 are patterned to form an opening 92 that exposes a portion of the conductive plug 84 as shown in FIG. 9. A first capacitor electrode film 101 and a buffer film 103 are formed over the hard mask film 166 and within the opening 92 as shown in FIG. 10. In this embodiment, the first capacitor electrode film 101 includes a material that is more difficult to chemical-mechanical polish. For example, the first capacitor electrode film 101 includes a noble metal, such as platinum, palladium, iridium and the like, or another material including rhenium, ruthenium, osmium, oxides of those films or any combination thereof.

The buffer film 103 can include any of the materials used that were described with respect to buffer layer 164. Because buffer film 103 can be removed separately from buffer film 164, the selection of materials that can be used is greater than for buffer film 164. Buffer film 103 can include an oxide, the same or similar material as insulating film 162, or even other materials.

Figure 11:
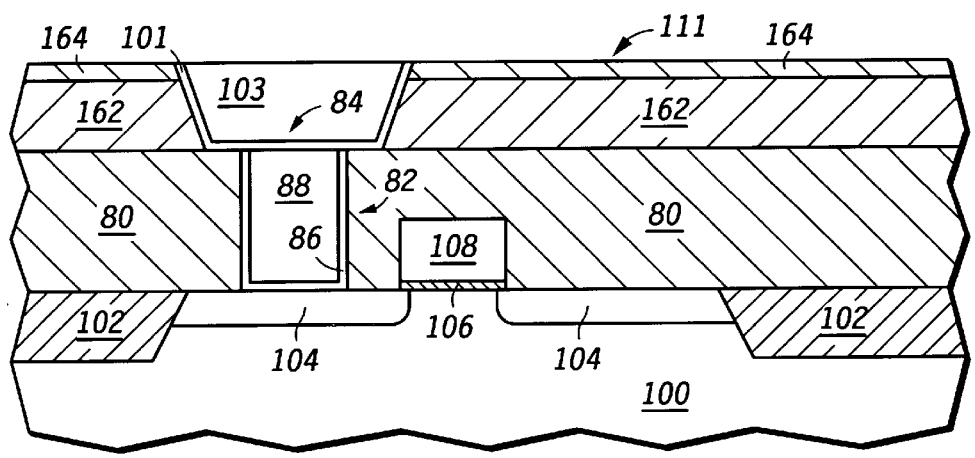

Polishing is performed to remove portions of the first capacitor electrode film 101 and buffer film lying outside the opening 92 and achieve a substantially planar surface 111 as illustrated in FIG. 11. Remaining portions of the hard mask film 166 and most of the buffer film 164 are also removed. The polishing is terminated before all the buffer film 164 is removed.

Figure 12:
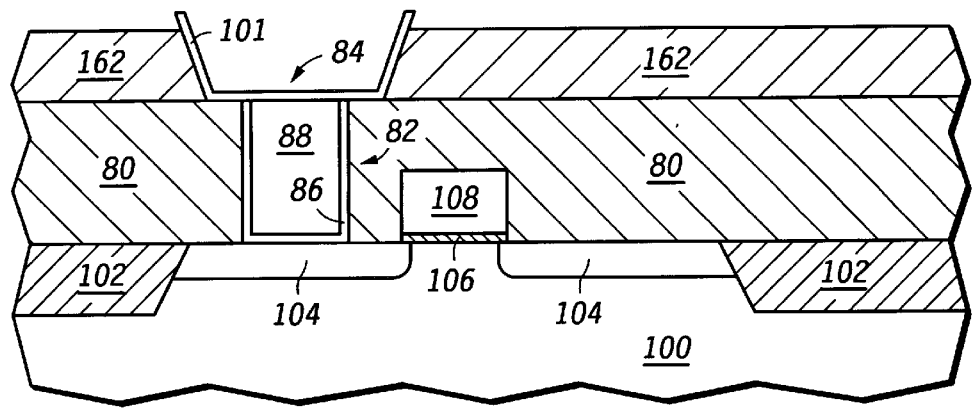

The remaining portions of the buffer films 103 and 164 are then removed as illustrated in FIG. 12. Films 103 or 164 can be removed during the same or different operations. If possible, films 103 and 164 should be removed simultaneously to reduce cycle time. If buffer film 103 includes the same or similar material as insulating film 162, film 103 should be removed before film 164. Still, buffer film 103 can be removed after buffer film 164 if the removal does not adversely affect the insulating film 162 and first capacitor electrode film 101.

Figure 13:
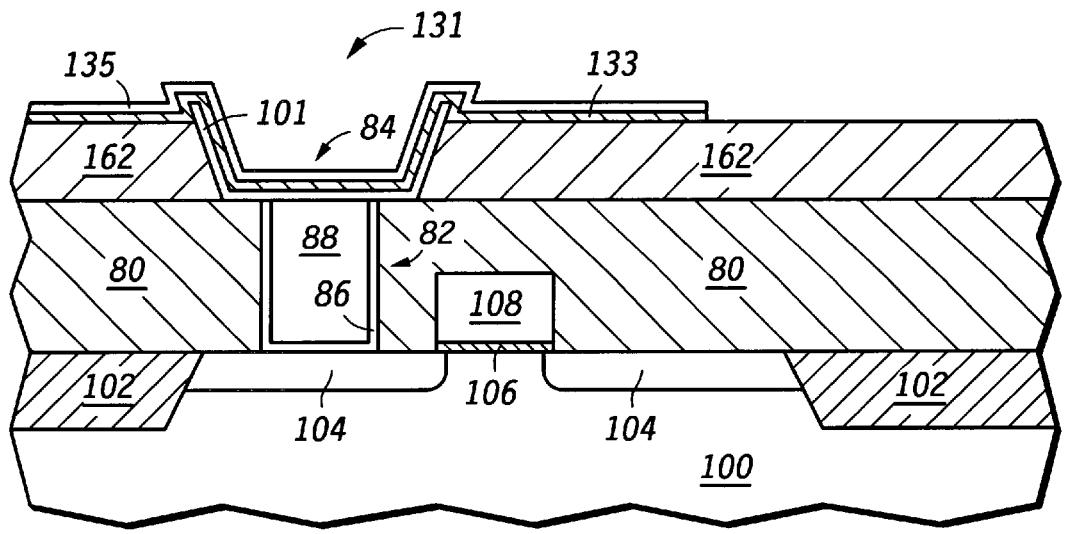

A capacitor dielectric film 133 is formed over the first capacitor electrode film 101 and portions of the insulating film 162. A second capacitor electrode film 135 is then formed over the capacitor dielectric film 133. The capacitor dielectric film 133 and capacitor electrode 135 are then patterned to finish formation of the capacitor 131 as shown in FIG. 13. The capacitor 131 is electrically connected to one of the doped regions 104 of the transistor shown in FIG. 13.

Figure 14:
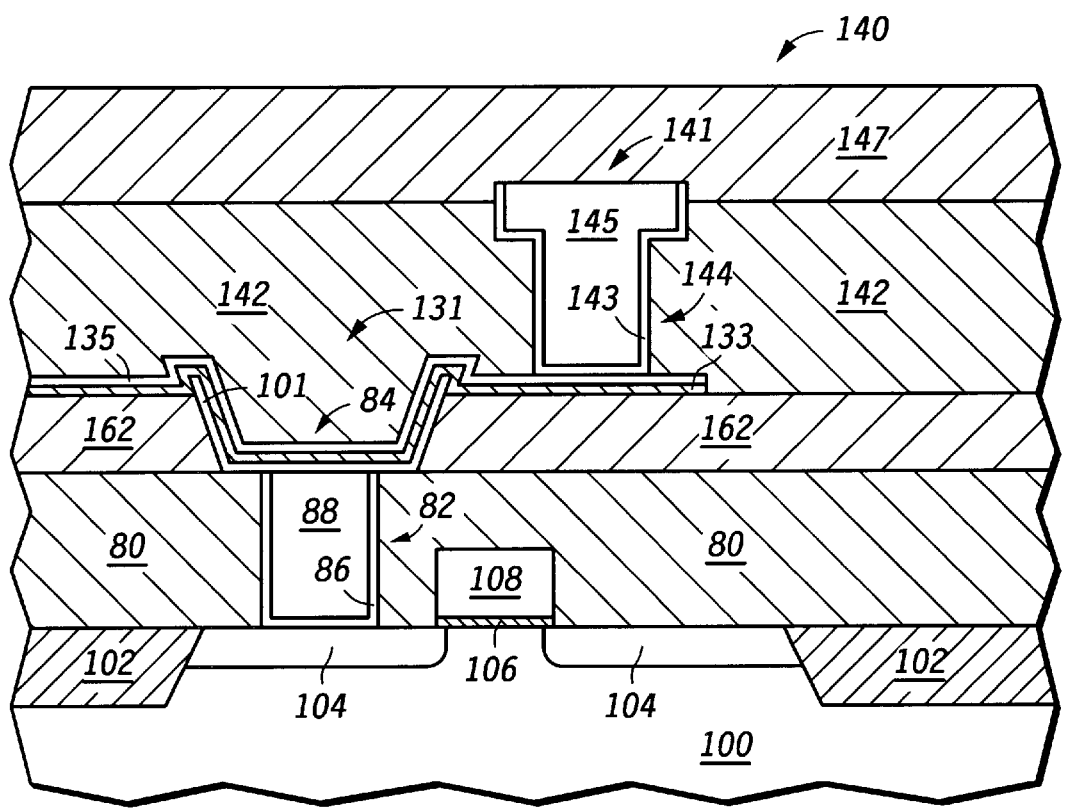

Processing is continued to form a form a substantially completed semiconductor device as illustrated in FIG. 14. Insulating film 142, a buffer film (not shown), and a hard mask film (not shown) are formed over the capacitor 131 and insulating film 162. The insulating film 142, buffer film, and hard mask film can be formed using any of the materials or methods described previously regarding films 162, 164, and 166. A dual-inlaid opening 144 is formed. A barrier film 143 and conductive fill material 145, such as copper, aluminum, tungsten, and the like, are formed within the dual-inlaid opening 144.

Portions of the barrier film 143 and conductive fill material 145 overlying the uppermost surface of the insulating film 142 are removed by polishing. The polishing also removes the hard mask film and most of the buffer film. The remaining portions of the buffer film are removed. This process sequence is similar to the process sequence described in forming the interconnect 52. A passivation layer 147 is formed over the interconnect 141 and the insulating film 142. The passivation layer 147 can include one or more films. Although not illustrated in FIG. 14, other electrical connections are made to the gate electrode 108 and other doped region 104. Further, additional ILD layers and interconnects can be formed as necessary to make the proper electrical connections within the semiconductor device.

Figure 15:
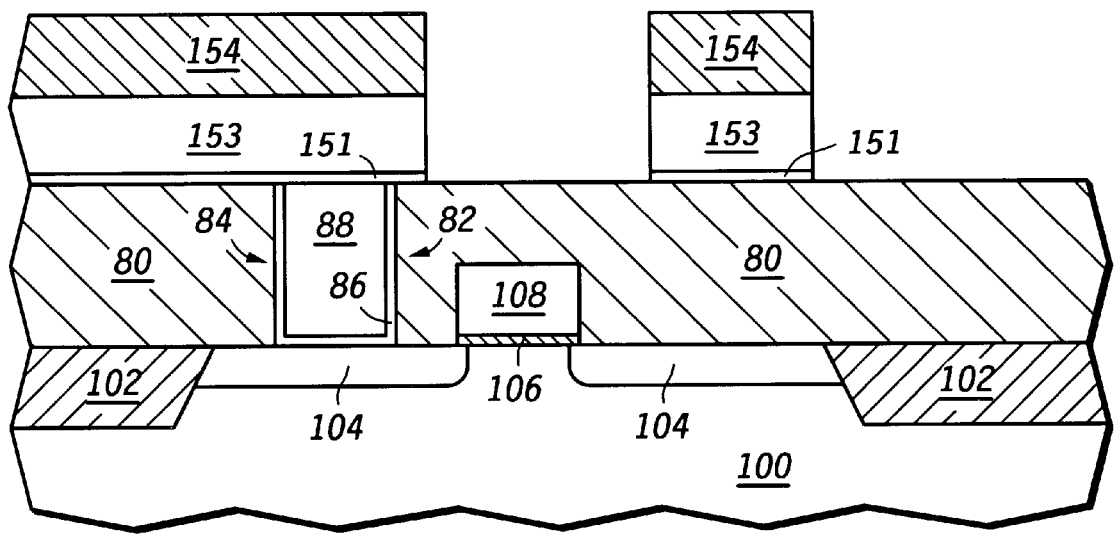
FIGS. 15–19 include illustrations of cross-sectional views of a portion of a semiconductor device during fabrication in accordance with still another embodiment of the present invention.

In still another embodiment, a buffer film can be used to protect conductive materials from being scratched, smeared, or causing other defects during an insulating film polishing step. A gate electrode 108, a first ILD layer 80, and conductive plug 84 are formed over the substrate 100 as shown in FIG. 15. A barrier film 151, a conductive film 153, such as aluminum, an aluminum alloy, and the like, and a buffer film 154 are formed over the conductive plug 84 and first ILD layer 80. The buffer film 154 can include any of the materials previously described for buffer film 164. The buffer film 154 needs to be removed selectively and without significantly adversely affecting a subsequently formed insulating film. The buffer film can also be an antireflective film or an optional, separate antireflective film (not shown) can be formed between the conductive and buffer films 153 and 154 or over the buffer film 154. Also, an optional hard mask film could be formed over the buffer film 154 but is not shown in FIG. 15. The barrier, conductive, and buffer films 151, 153 and 154 are patterned using a conventional process as shown in FIG. 15.

Figure 16:
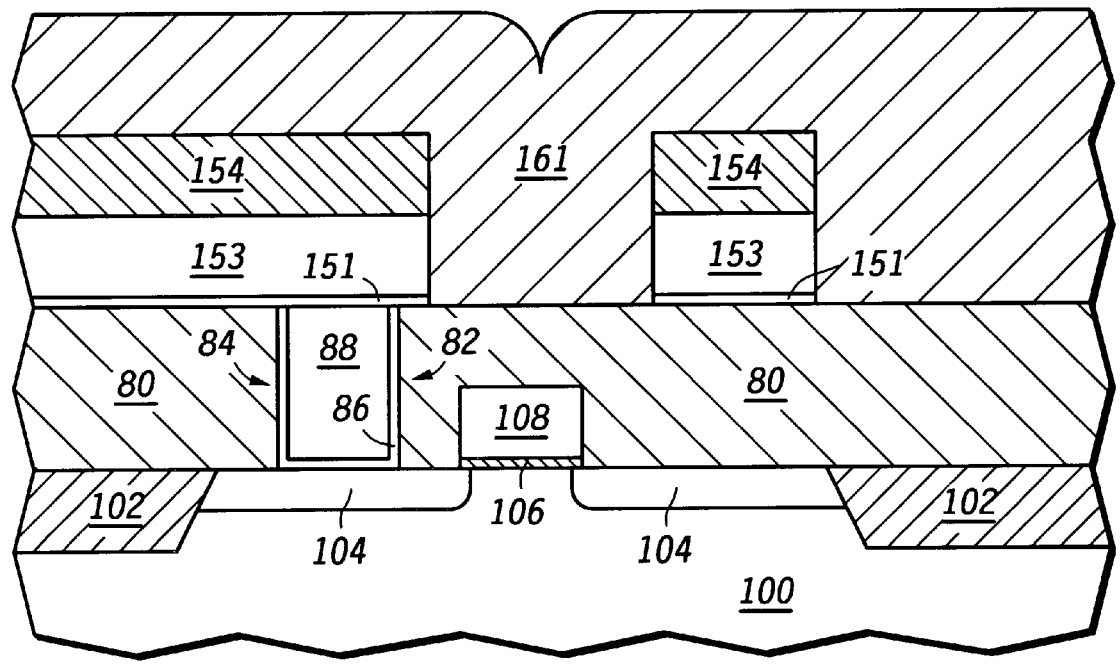
Figure 17:
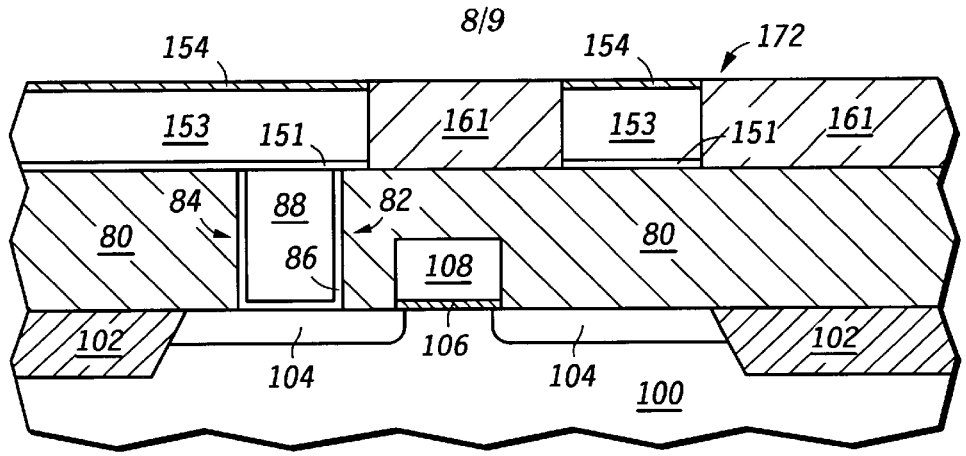
Figure 18:
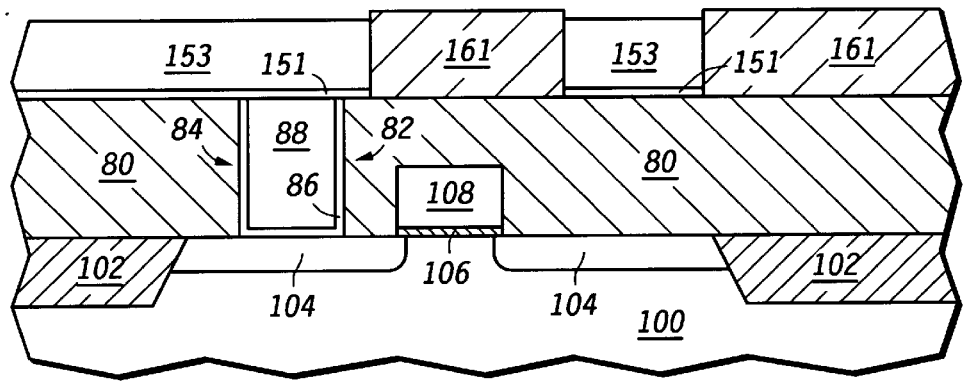

An insulating film 161 is formed over the first ILD layer 80 and patterned films in FIG. 16. The insulating film 161 fills the gaps between the remaining portions of films 151, 153, and 154. The insulating film 161 is polished to remove portions of the insulating film 161 and most of buffer film 154 overlying the remaining portions of the conductive film 153, thereby forming a substantially planar surface 172 in FIG. 17. The remaining portions of the buffer film 154 are removed to expose the conductive film 153 in FIG. 18. In this embodiment, a gap fill process is used without exposing the conductive film 154 during the insulating film 161 polishing step. In an alternative embodiment, the buffer layer 154 may remain if it does not adversely affect performance. Unlike polish-stop layers, most of the buffer film 154 is typically removed during the polishing operation.

Figure 19:
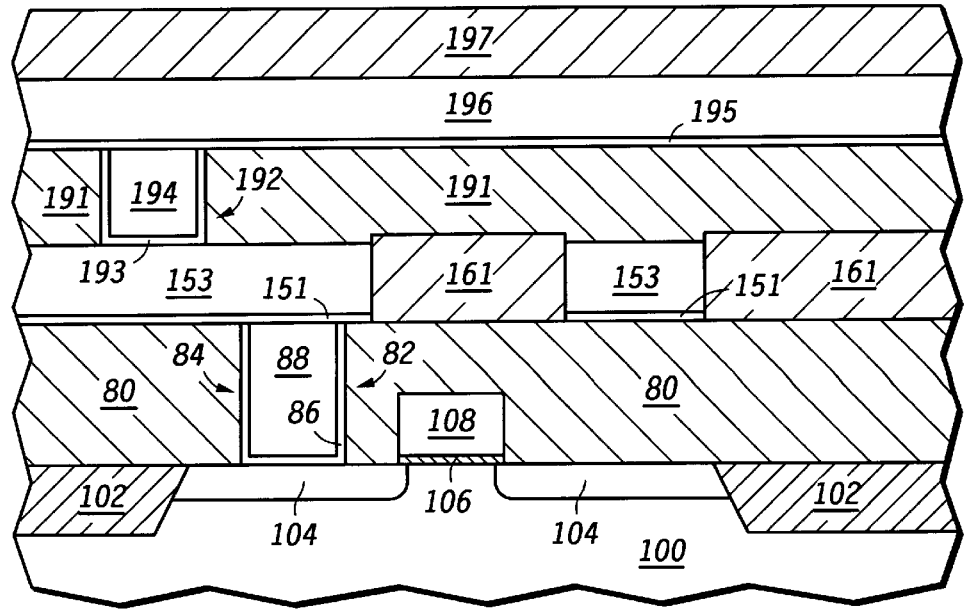

Processing is continued to form a substantially completed semiconductor device shown in FIG. 19. A second ILD layer 191 is formed and patterned to form an opening. The opening is filled with a conductive plug 192 that includes a barrier film 193 and 194. A barrier film 195 and conductive film 196 are deposited and patterned. A passivation layer 197 is formed over the patterned films. Similar to prior embodiments, electrical connections are made to gate electrode 108 and doped region 104 but are not shown in FIG. 19. Also, additional ILD layers and interconnect levels can be added, if needed.

Figure 20:
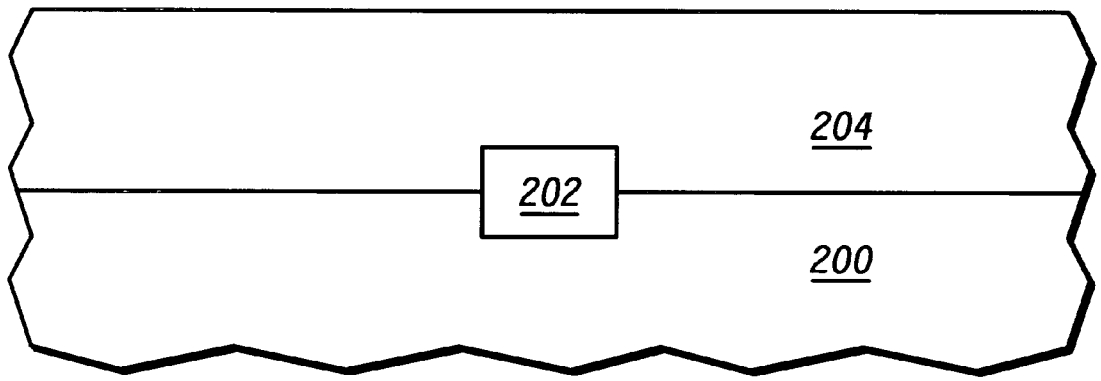
FIGS. 20 and 21 include illustrations of cross-sectional views of portions of a semiconductor device that include other embodiments of the present invention.
Figure 21:
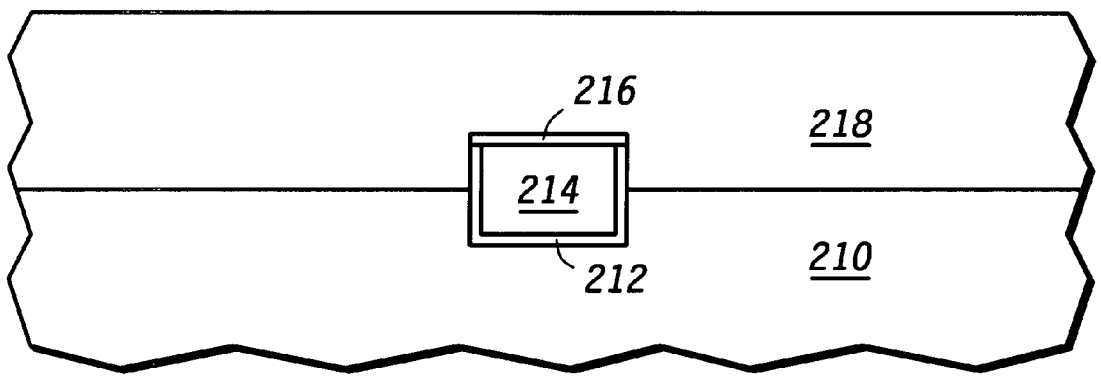

FIGS. 20 and 21 include other embodiments that can be formed using a buffer film. FIG. 20 includes an illustration of a cross-sectional view of an optical waveguide. Films 200, 202 and 204 are insulative materials. Film 202 has a higher refractive index compared to each of films 200 and 204. The optical waveguide can be formed in a manner similar to those previously described. A buffer film (not shown) is formed over film 200. Film 200 is typically gallium arsenide, silicon dioxide, indium phosphide, lithium niobate, or polymers including polymethylmethacrylate, polyimide, polyurethane, polyester, or the like. Film 202 is formed over the buffer film and within the opening. After polishing, only that portion of film 202 within the opening remains. The remaining portion of the buffer film is removed, and film 204 is formed over films 200 and 202. Film 204 also has a lower index of refraction compared to film 202. Typically film 204 is made of the same or a similar material as those listed for film 200.

FIG. 21 includes an illustration of a cross-sectional view of a conductor buried within another conductor. Conductive films 210 and 218 form a conductor that surrounds conductive film 214. Conductive film 214 is separated from conductive films 210 and 218 by insulating films 212 and 216. This structure can be used to form a capacitor or to protect conductive film 214 from radiation effects if films 210 and 218 are electrically connected to a fixed potential electrode (i.e., $V_{SS}$ or $V_{DD}$).

Similar to the prior embodiments, a buffer film (not shown) is formed over conductive film 210. An opening is formed through the buffer film but only partially (not completely) through film 210. An insulating film 212 and conductive film 214 are sequentially deposited to fill the opening. Polishing is performed to remove portions of the films 212 and 214 lying outside the opening. Most of the buffer film is removed during the polishing. Remaining portions of the buffer film is removed. Insulating film 216 is formed over the remaining portion of conductive film 214. Conductive film 218 is formed over the films 210 and 216 and contacts film 210. Film 210, 214, and 218 can include the same or different materials. Typically, films 210, 214, and 218 include copper, aluminum, tungsten, polysilicon, or the like.

Buffer films 154 and 164 are good at reducing the formation of scratches within films when polishing an overlying film, whether it is an insulating film or a conductive film. When an interconnect includes a barrier film and a conductive fill material, the barrier layer typically includes a refractory metal compound and is harder compared to the conductive fill material. If portions of the barrier film break off as particles, scratches are formed in the buffer film instead of the insulating film. Therefore, the insulating film 162 is protected from scratches that can cause physical and electrical defects.

When polishing a layer difficult to remove, such as the first capacitor electrode film 101, additional force and other more aggressive mechanical parameters are used to remove the layer. Although the barrier film may or may not be present in this embodiment, the aggressive conditions are more likely to cause scratches and other defects within the underlying insulating film. Again the buffer layer absorbs the abuse and is subsequently removed.

In the gap fill process illustrated in FIGS. 15–19, the buffer film 154 reduces the likelihood of gouging the conductive film 153 or smearing it during polishing is reduced. Gouges are physical defects and can affect the resistance or electrical properties of the conductive film 153. Smearing may cause residual portions of the conductive film 153 to create an electrical short or leakage path between interconnects.

Optical waveguides can be formed with a lower likelihood of scratches. Also, buried or surrounded conductors are formed without difficulty.

More controlled thickness over the insulating film 162 can be achieved in some embodiments. If the buffer film 164 was not present, typically over polishing is continued which erodes a significant portion of the insulating film 162 to make sure that all residual portions of the conductive film or capacitor electrode film are removed (no stringers or other residual portions that may cause an electrical short or a leakage path within the semiconductor device). This erosion generally is undesired because it reduces the thickness of the insulating film between underlying and overlying conductors. The thinner insulating film increases the line-to-line capacitance within the structure (slower device) or the likelihood that a signal or potential in one of the conductors is significantly disturbed by the signal or potential in the other conductor.

Still another benefit is that a buffer film can be integrated into a process flow without the having to obtain new equipment. The process integration is relatively straight forward.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described above with regard to specific embodiments. However, the benefits, advantages, solutions to problems, and any element (s) that may cause any benefit, advantage, or solution to occur or become more pronounced are not to be construed as a critical, required, or essential feature or element of any or all the claims.

I claim:

1. A process for forming a semiconductor device comprising:

forming an insulating film over a substrate and a conductive region;

forming a first buffer film over the insulating film;

patterning the first buffer film and the insulating film to form an opening, wherein a portion of the opening exposes a portion of the conductive region;

forming a first conductive layer over the first buffer film and within the opening, wherein the first conductive layer contacts the conductive region; and removing a portion of the first conductive layer overlying the insulating film and most of the first buffer film that overlies the insulating film.

2. The process of claim 1, wherein:

most of the first buffer film is removed during removing the portion of the first conductive layer, wherein a remaining portion of the first buffer film is formed; and the process further comprises removing the remaining portion of the first buffer film.

3. The process of claim 1, wherein the insulating film includes a porous material.

4. The process of claim 1, wherein the insulating film includes an organic material.

5. The process of claim 1, wherein removing the first buffer film comprises a method selected from a group consisting of decomposing the first buffer film, dissolving the first buffer film, evaporating the first buffer film, and exposing the first buffer film to an oxygen-containing plasma.

6. The process of claim 1, wherein the first buffer film comprises a material selected from a group consisting of benzo-cyclobutene, polyvinylacetate, polyvinylalcohol, polyethylene, polypropylene, and polymethylmethacrylate.

7. The process of claim 1, wherein the first buffer film has a thickness of at least approximately 100 nanometers.

8. The process of claim 1, further comprising forming a hard mask film over the first buffer film before patterning.

9. The process of claim 1, further comprising forming a passivation layer after removing the portion of the first conductive layer.

10. The process of claim 9, wherein the first conductive layer includes a barrier film, wherein the barrier film includes a refractory metal material.

11. The process of claim 9, further comprising forming a hard mask film over the first buffer film before patterning.

12. The process of claim 1, further comprising:
    forming a second buffer film over the first conductive layer;
    polishing the second buffer film before removing the first conductive layer; and
    removing the second buffer film after removing the first conductive layer.

13. The process of claim 12, further comprising:
    forming a dielectric film over the first conductive layer;
    forming a second conductive layer over the dielectric film;
    patterning the second conductive layer to form a capacitor; and
    forming an interconnect film over the second conductive layer and the insulating film.

14. A process for forming a semiconductor device comprising:
    forming a first film over a substrate;
    forming a second film over the first film;
    patterning the first and second films to form an opening, wherein the opening extends through all the second film and at least partially through the first film;
    forming a third film over the second film and within the opening;
    removing a portion of the third film that overlies the second film and most of the second film that overlies the first film.

15. The process of claim 14, wherein:
    the first and third films are insulative films; and
    a refractive index of the third film is higher than a refractive index of the first film.

16. The process of claim 14, further comprising:
    forming a fourth film after patterning and before forming the third film;
    forming a fifth film along exposed portions of the third film after removing the portion of the third film; and
    forming a sixth film over the fifth film and the first film, wherein the first, third, and sixth films are conductive films, and wherein the fourth and fifth films are insulative films.

17. The process of claim 16, further comprising removing all remaining portions of the second film before forming the sixth film.

18. The process of claim 14, further comprising forming a passivation layer of the substrate after removing the portion of the third film.

* * * * *